(12) United States Patent
Fjelstad et al.

(10) Patent No.: US 7,310,239 B1
(45) Date of Patent: Dec. 18, 2007

(54) IC PACKAGING INTERPOSER HAVING CONTROLLED IMPEDANCE OR OPTICAL INTERCONNECTIONS AND AN INTEGRAL HEAT SPREADER

(75) Inventors: Joseph C. Fjelstad, Maple Valley, WA (US); Kevin P. Grundy, Fremont, CA (US)

(73) Assignee: Silicon Pipe, Inc.

( * ) Notice: Subject to any disclaimer, the term of this patent is extended or adjusted under 35 U.S.C. 154(b) by 370 days.

(21) Appl. No.: 11/062,112

(22) Filed: Feb. 18, 2005

Related U.S. Application Data

(60) Provisional application No. 60/546,344, filed on Feb. 20, 2004.

(51) Int. Cl.
*H05K 1/18* (2006.01)
(52) U.S. Cl. ............................ 361/764; 439/65; 439/75

(58) Field of Classification Search ................ 174/262; 439/66, 679, 65–75
See application file for complete search history.

(56) References Cited

U.S. PATENT DOCUMENTS

| | | | | |
|---|---|---|---|---|
| 5,296,652 | A | * | 3/1994 | Miller, Jr. .................... 174/265 |
| 5,633,479 | A | * | 5/1997 | Hirano ....................... 174/255 |
| 5,654,528 | A | * | 8/1997 | Tanaka ....................... 174/266 |
| 6,590,479 | B2 | * | 7/2003 | Yoshida et al. ............. 333/260 |

* cited by examiner

*Primary Examiner*—Tuan T. Dinh
*Assistant Examiner*—Abiy Getachew
(74) *Attorney, Agent, or Firm*—Ronald R. Shea, Esq.

(57) ABSTRACT

Disclosed are embodiments of an integrated circuit die interconnection interposer suited to controlled high performance transmission of electronic or optical signals or combinations thereof. The various embodiments are designed to provide direct path interconnections away from the surface of one or more integrated circuit die. The structures are amenable to improved thermal management and can be fabricated on at semiconductor wafer.

16 Claims, 6 Drawing Sheets

IC PACKAGING INTERPOSER HAVING CONTROLLED IMPEDANCE OR OPTICAL INTERCONNECTIONS AND AN INTEGRAL HEAT SPREADER

CROSS-REFERENCE TO RELATED APPLICATIONS

This application claims priority from, and hereby incorporates by reference, U.S. Provisional Application No. 60/546,344, filed Feb. 20, 2004 and entitled "IC Packaging Interposer Having Controlled Impedance or Optical Interconnections and an Integral Heat Spreader."

FIELD OF THE INVENTION

The present invention relates to the field of IC packaging for high speed signal transmission and the thermal management of the energy associated therewith.

BACKGROUND

IC packages serve to space transform the I/O of an IC chip to a pattern and pitch which is more suitable to the needs of a next level interconnection device. The next level device may be another IC package, an electronic module or an interconnection substrate such as a printed circuit board (PCB). IC packages are thus created in a wide variety of different constructions based on the requirements of the application ands the number of input/output (I/O) terminals on the die. The package constructions themselves vary from chip scale and wafer level packages created near or at the size of the IC die, to leadframe type structures, to highly complex multi layer interconnection structures all of which serve to translate the I/O on the chip from a fine pitch to a more useful pitch.

IC package substrate structures, especially those used for high performance applications, are designed with great care in an effort to precisely control the characteristic impedance of the electronic signal from the chip to the next level interconnection device. Due to the complexities of the traditional approach to design, manufacture and assembly, signal quality is often degraded or compromised by the intrinsic frailties and inefficiencies of those same design and interconnection manufacturing technologies employed in the creation of higher performance IC packages. Some relief can be obtained by use of more exotic materials which provide a more acceptable signal quality, however, those gains are achievable only at costs that often exceed in multiples the cost of IC they are packaging. While solutions continue to be developed to solve the electrical problems, optical interconnections will be similarly challenged as optical IC solutions come of age. Moreover, it is anticipated that both electrical and optical solutions will be required on a common IC in the near future.

In general, transmission of high speed signals, whether achieved electrically using metal or other conductive materials or optically using optical fiber, requires that precise control of the structure and materials be maintained at every point along the transmission path, starting at the chip itself, to ensure the quality of the transmitted signal. Any disruptions along the transmission path will degrade signal quality. Thus there is present and future need for improved IC package and interconnection structures and alternative interconnection methods that will meet the needs of both high speed electrical and optical interconnections both separately and together and in doing so meet the performance and cost demands of next generation electronic products.

BRIEF DESCRIPTION OF THE DRAWINGS

The present invention is illustrated here by way of example, and not by way of limitation, in the figures of the accompanying drawings and in which like reference numerals refer to similar elements and in which.

DETAILED DESCRIPTION

Figure 1:
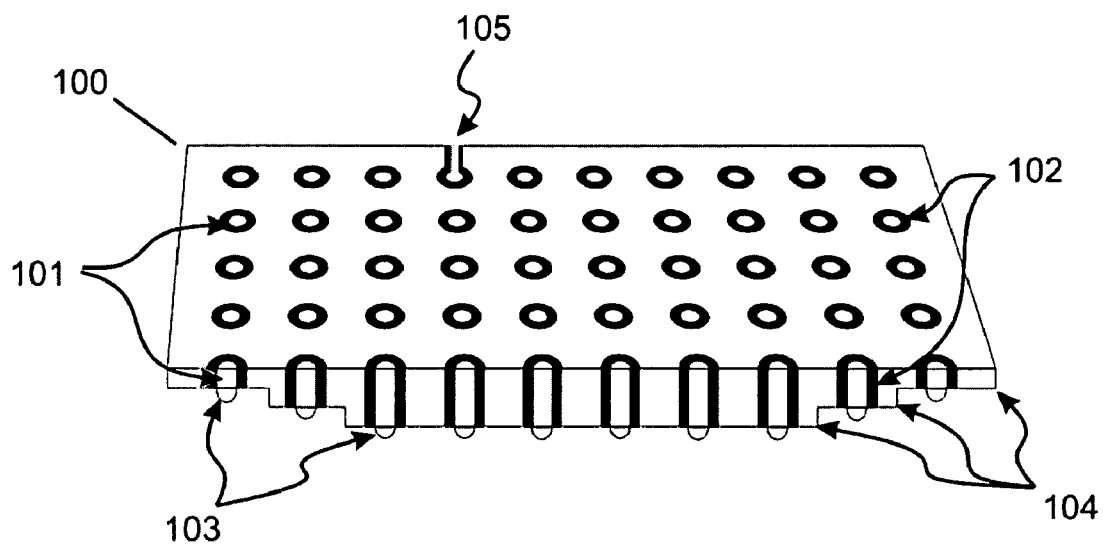
FIG. 1 provides a perspective cutaway view of an embodiment having coaxial interconnections provided through a stair stepped base.

In the following description and in the accompanying drawings, specific terminology and drawings are set forth to provide a thorough understanding of the present invention. In some instances, the terminology or drawings may imply need for specific details that are not required to practice the invention in its fundamental form.

Among signal path constructions, impedance controlled structures such as coaxial connections are considered by electronic signal integrity experts to be ideal. Thus making coaxial connections to I/O on the IC die by extension can also be considered to be an optimal or ideal connection. The present invention is intended to provide a direct, impedance controlled pathway, such as a coaxial connection from the chip to either the body of a package or an interconnection substrate. In addition to providing an electrical path, the structure is well suited to facilitating making optical interconnection to the surface of the chip as well. For electrical signals, the structure allows for impedance control of the signal to begin immediately upon the signal exiting the chip.

Disclosed herein are embodiments of an integrated circuit die interconnection interposer suited to controlled high performance transmission of electronic or optical signals or combinations thereof. The various embodiments are designed to provide direct path interconnections away from the surface of one or more integrated circuit die. The optimal path is orthogonal (i.e. at right angles) to the chip, for shortest path. However, other angles of attachment may be used without departing from the spirit and scope of the present invention.

The structure provides a special translation element that facilitates routing I/O either into a suitably designed package or onto a suitably designed interconnection substrate. In one embodiment, the structure includes a substrate of a suitable material such as a metal (e.g. copper, molybdenum, etc.) or alloy (iconel, invar, etc.) or an insulating material (e.g. ceramic or organic filled or unfilled sheet or laminate) coated with metal. Openings, such as holes, are drilled, etched or otherwise created into the substrate with a pattern that aligns with features of interest on the IC chip to which it is to be interconnected. If an insulating material is used, the structure is plated with metal (e.g. copper). An insulating coating can be applied over the metal to prevent shorting to the conductive material surfaces when the interposer is attached to the chip. The insulation could also be a suitable adhesive pre-applied to the metal before holes are drilled. Moreover, the adhesive may have a thermally conductive material within it to provide an improved thermal path from the surface of the IC die to the metal, which can serve as both ground and thermal spreader.

The openings (e.g., holes) in the interposer substrate serve as conduits for either electrical or optical signals. The body of the structure, being either metal or metallized insulation, can be constructed so as to create a coaxial interconnection path from the surface of one side to the surface of the second side. The coaxial interconnection pathways can be created in several ways. For example, it is possible to fill the holes in the metal or metallized insulator with a suitable dielectric material, drill holes through the center of the fill and then either plating the opening or placing a metal pin in the drilled hole. In another example of method, insulated wires may be placed or fitted into the holes. In yet another example of method, wires may be bonded leaving vertical tails and the metal or metallized interposer substrate having holes in it placed over the matching pattern of vertical wires. In the latter case, a liquid, dielectric may be used to first flood the surface of the die and wires and capillary action employed to fill the holes, followed by a cure step. For optical interconnection application, the wires can be replaced with optical fibers positioned in the chosen openings. Moreover, combinations of the two may be desired and are possible. The body of the interposer can be fully planar but can also be provided with stair steps to facilitate in egress of signals from the interposer to a package or substrate, which has as part of its design, mating stair steps, which are more easily mated and interconnected to in order to make the desired higher performance connectors.

As stated earlier, because the body of the structure can be all metal if desired, it is possible that the interposer could serve as a heat spreader and provide an auxiliary thermal path for heat removal. Moreover, the invention relates to IC interposer structures suited to either high-speed electrical connections, optical connections or a combination thereof in either In FIG. 1 is illustrated an embodiment of an interposer 100 having stair step interconnections 104 on a first side with the opposite side having a planar array of coaxial I/O terminals 101 disposed for subsequent interconnection to I/O terminals on an IC die and further disposed to follow the general contours of a stair stepped IC package to which it is to be joined. The body of the structure can be constructed from all metal or from a suitable insulator plated with metal on the surfaces and through the holes (not shown). The holes are desirably filled with an insulator 102 to support and space coaxial conductors 101 away from the hole walls. In fabricating the structure the filled holes may be drilled and filled with metal pins which or other suitably conductive material such as compactable or sinterable metal paste which serve as conductors 101. Alternatively the holes may be filled with insulated wires pressed into them. Terminations on the bottom side of the device can be provided with a joining material 103 (e.g., solder, conductive adhesive or non conductive adhesive). Alternatively the coaxial connections could extend slightly beyond the surface and interconnected to the IC die by means of an anisotropic conductive adhesive.

While both sides of the structure can be fully planar and parallel, the terminations on the side opposite the chip can be made planar, rise above or set below the various plane levels of a mating IC package. In other words, the body of the structure can be provided with stair steps 104 to facilitate egress of the signals from the package with out using traditional unshielded vias.

In one embodiment, the upper surface of the device is designed to provide selected interconnection circuits on the top side 105 to facilitate cross-chip interconnections or interconnections to other devices either in stacked form or edge connected such as by wire bonds or other suitable interconnection methods. This can be accomplished by increasing the size of the interposer substrate to support the requirements of the design.

The terminations to the chip can be dual path and exit from a common terminal (e.g. twin axial) if desired and interconnected both through the interposer and off of its surface. In addition, because in certain embodiments, the body of the structure can be all metal, the interposer device can desirably serve also as a heat spreader and provide an auxiliary thermal path for heat removal. Moreover, the body of the device may be extended laterally to increase its surface area for increased heat spreading if desired (not shown). A keying feature can be provided to assure proper alignment of the interposer to the assembly.

Figure 2:
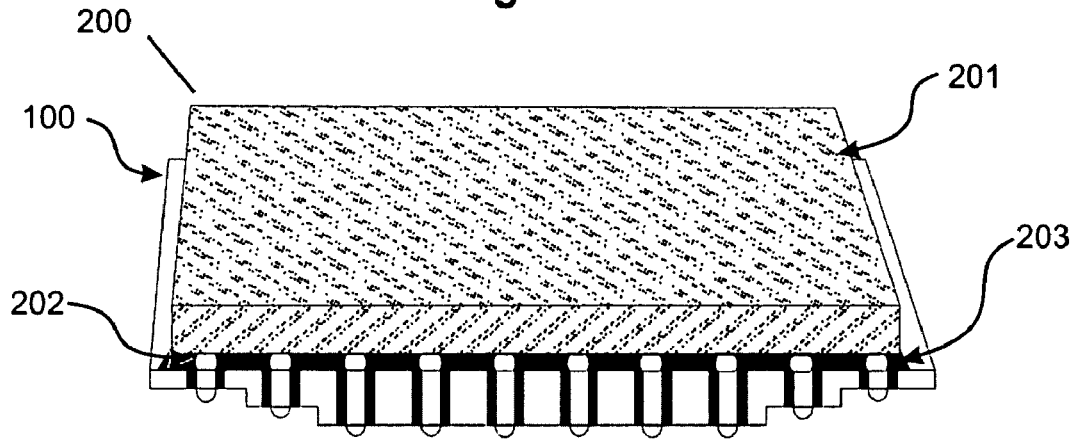
FIG. 2 provides a perspective cutaway view of the embodiment illustrated in FIG. 1 with an IC chip mounted to the device.

In FIG. 2 is illustrated the interposer substrate with coaxial connections with an IC die mounted to it in a flip chip fashion 200. While only one die is shown, more than one IC die can be mounted to the surface if desired.

The IC die 201 is provided with a suitable underfill material 202 to protect the terminations 203 which are made directly to the end surfaces of the coaxial wires which traverse from a first side to opposite side within and through the body of the interposer. Ground terminations (not shown) may be made to the surface of the interposer at locations positioned between the coaxial contacts on its surface to improve signal integrity if desired.

Figure 3:
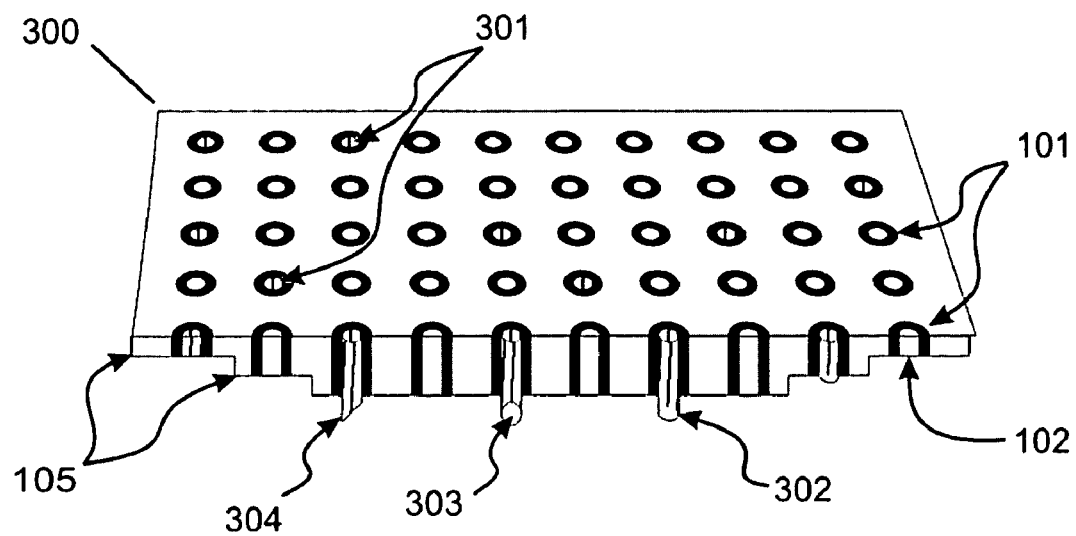
FIG. 3 provides a perspective cutaway view of an embodiment having both coaxial interconnections and optical fiber pathways from side to side on a stair stepped base.

In FIG. 3 is illustrated an interposer assembly embodiment 300 disposed to make both coaxial electric 102 and optical interconnections 301 to one or more IC die. The optical fiber terminations can be made to recede from, stay planar with or protrude from the body of the interposer device 302. The protruding fibers can cut square relative to the length 302 or alternatively can be pre or post processed in a manner suitable for making directional changes to the optical signals by chamfering the fibers 303 and 304 at desired angle and rotation thus creating a prism which directs the optical signal to a predetermined path. Alternatively, the receiving substrate can be fitted with prisms to accomplish directional change at the next interconnection level.

Figure 4:
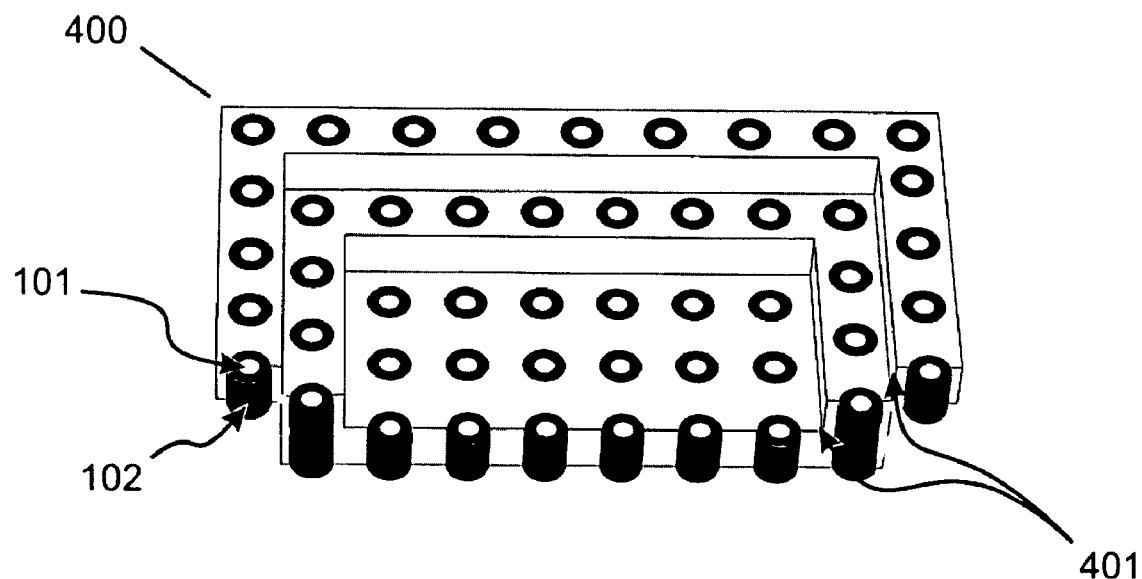
FIG. 4 provides perspective cutaway of another embodiment wherein stepped cavities and stepped termination exit points are combined in a single structure.

FIG. 4 illustrates an embodiment suited to accepting multiple stacked chips inside a single assembly 400. I/O terminations on the assembly designed for IC die connections can be stepped internally 401 to accept die of different dimensions. The number and size of stair steps on first and second sides need not be identical. For example, a three die internal stair step stack can be terminated on the side opposite with an equal or lesser number of stair steps down to a single common plane of contacts.

Figure 5:
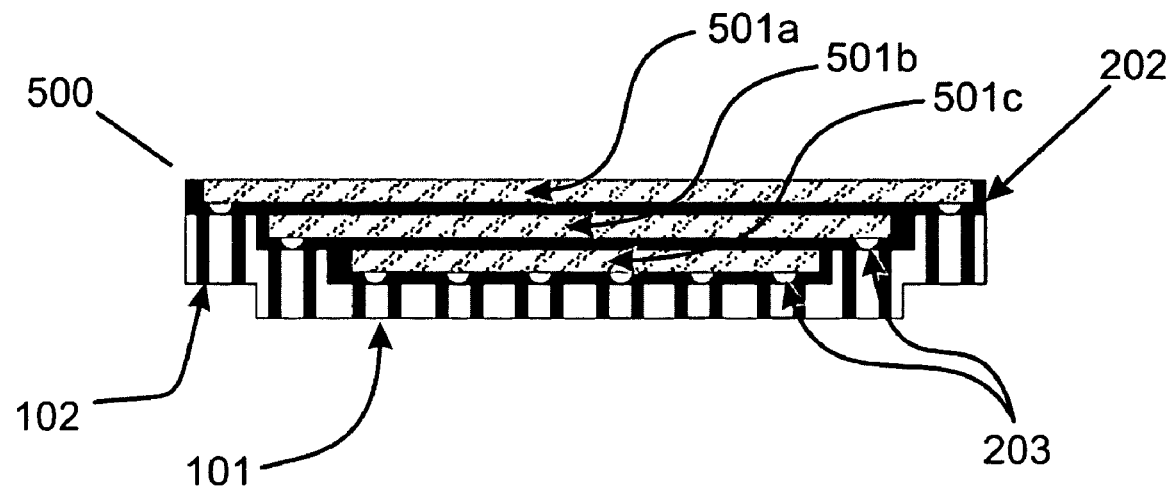
FIG. 5 provides a cross sectional view of an embodiment of an assembly with IC chips stacked and interconnected at different layers inside the interposer.

FIG. 5 illustrates an embodiment of an inner and outer stair stepped package interposer with IC die assembled within 500. Terminations from two or more stacked IC die can exit the package at one common level (501*b* and 501*c*) or at multiple levels as required by the design. The final structure may be considered as an integrated die assembly that may be packaged again at a next level if desired.

Figure 6:
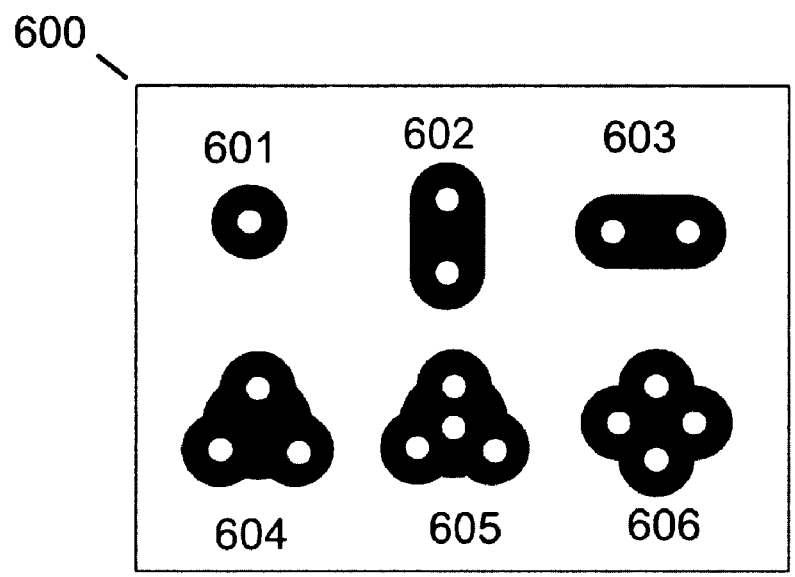
FIG. 6 provides a planar view of a surface of having different prospective I/O configurations including coaxial, twin-axial, tri-lead, and quad-lead useful in various embodiments.

FIG. 6 illustrates various useful terminations that can be employed for interconnections signal pathways traversing the interposer 600. A typical coaxial structure is presented at 601. 90 degree offset configurations of twin axial structures are represented by 602 and 603. A tri-axial structure having three leads for use as, for example, power, ground and signals is represented by 604. A quad lead triangular structure is illustrated by 605 and an alternative quad lead structure is represented by 606. Although the number of separate conductors captured within an insulating material as shown is limited for purposes of this illustration to four, there are no limits to the number of signal conductors which may be grouped to traverse thorough an insulating interposer structure.

Figure 7:
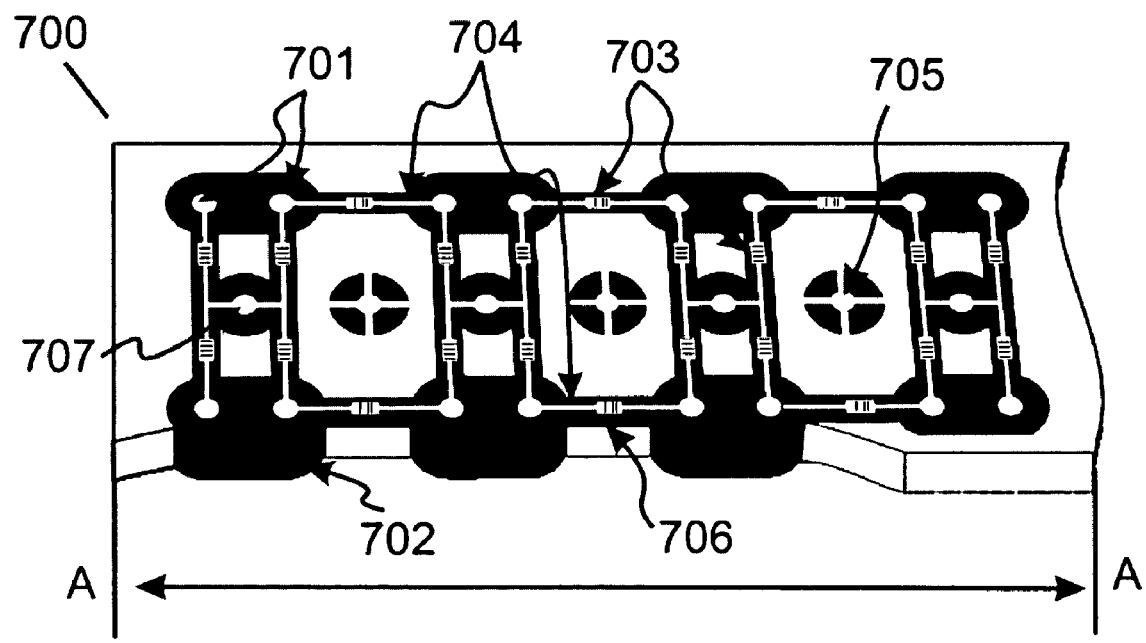
FIG. 7 provides a perspective view of a partial structure, with a cutaway, of an embodiment having passive components mounted and connected to, or integrated into signal paths.

FIG. 7 shows a perspective view with a cutaway of a partial structure of an embodiment having surface conductors and passive devices 700. The structure 700 has, for purposes of example, differential pair conductors 701 which traverse the body and which are surrounded by insulating material 702 that supports and separates the conductors from the supporting structure. Circuit paths 704 are provided on the surface of the assembly to provide connections to discrete devices 703. The discrete devices can be resistors, capacitors, or voltage switchable materials suitable for providing ESD (electro-static discharge) protection. This embodiment is useful due to the fact that in many integrated circuit designs, it is difficult to implement resistive, inductive or electrostatic protection circuits which meet the precision or specification levels necessary to achieve the desired performance. By removing these elements from the integrated circuit and making them part of the IC die interposer assembly, it is often possible to lower the cost and increase the performance of the overall system. Embodiments having included discrete devices on any face of the interposer thus offer additional value. In the embodiment shown the face of interposer can be milled or etched to create "reliefs" in the surface 706 creating room for the addition of discrete components 703 so that the discrete components do not rise higher than the surface of the interposer. The surface of the relief areas and the entire face of the interposer excepting contact termination surfaces can then be coated with a non-conductive material upon which conductive pathways may be placed to provide for connections to the conductors 704. The embodiment illustrates, by way of example, pull-up resistors 703 connected to a differential signal pair 701. Pull-up resistors 703 are connected to coaxial connector 707, which has the pull-up power supply source voltage. Connections 705 provide connections to ground.

Discrete ESD components can also connect to the twin-axial conductors, if desired, to provide integrated circuit ESD protection via their path to ground 705. The discrete components are not limited to separately mounted, individual components. Component functions may be constructed by the use of thin films or other deposition processes on the surface of the interposer.

Figure 8:
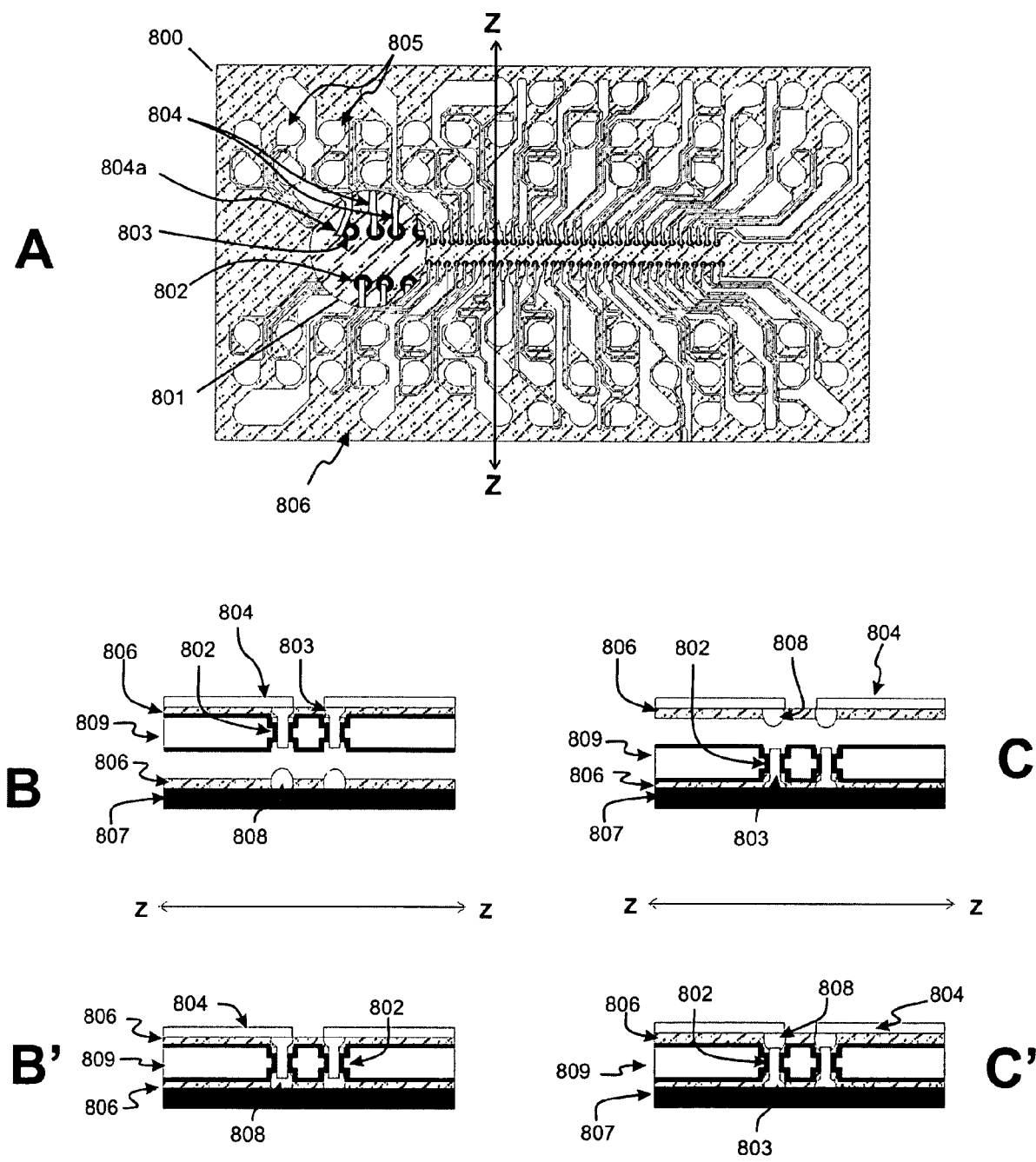
FIG. 8 provides surface and cross section views of embodiments suitable for use with die having center bond pads.

FIG. 8 provides surface 8A and cross section views of embodiments both pre-assembled, 8B and 8C, and after assembly, 8B' and 8 C', respectively. FIG. 8A shows a surface view of circuits and interconnections of a die having center bond pads 800. FIG. 8A also has an area of magnification 801 that provides detail of interconnection areas of the assembly. In the magnified detail area, the hole in the interposer is filled with insulation material 802 and the conductor 803 is centered within it. Connection is made from the center conductor 803 or circuit terminations on the redistribution circuits 804. For illustration purposes, one termination, 804*a*, is shown with the termination bent away to show the termination on the interposer. The circuits from the interposer are routed to distal termination points that are on a courser pitch 805. The circuit layer generally resides on an insulating material that may have an adhesive layer. 806. Finally, FIG. 8A has a section Z-Z that defines an area of cross section viewing for FIGS. 8B and 8 B' and FIGS. 8C and 8C'

In FIG. 8B shown in cross section, defined by the Z-Z in FIG. 8A, are shown an IC die 807 having an insulating/adhesive layer 806 and bumped contacts 808 of a suitable material (e.g., solder, conductive adhesive, etc.). Above the chip is shown an assembly comprising a conductive core of the general types described earlier 809 and having openings with insulating material 802 through which passes a conductor (e.g. a bond wire) 803 which is bonded to a circuit trace lead 804. The insulating material 802 can be used to cover all surfaces of the conductive core if desired. Openings can be left in the conductive core as well to allow for electrical connection to it if desired. The circuit traces are bonded to the core with an insulator/adhesive layer 806. FIG. 8B' shows the elements of FIG. 8B in an assembled embodiment form.

In FIG. 8C, shown in cross section defined by the Z-Z in FIG. 8A, are shown an embodiment of an IC die 807 having an insulating/adhesive layer 806 to which bond wires 803 have been bonded and project up from the surface of the chip. A conductive core of the general types described earlier 809 and having openings with insulating material 802 is positioned on the chip and adhered with an insulator/adhesive. The insulating material 802 can be used to cover all surfaces of the conductive core if desired. Openings can be left in the conductive core as well to allow for electrical connection to it if desired. The conductor wires to pass though the conductive core with the termination ends, distal from the surface of the IC die, exposed and disposed to attachment. Positioned above the just described assembly shown in FIG. 8C is a circuit layer with circuit traces 804 on an insulator/adhesive 806 and having bumped contacts 808 of a suitable material (e.g., solder, conductive adhesive, etc.) for joining and interconnecting to the exposed conductor contacts of the assembly below it in the figure. FIG. 8C' shows the elements of FIG. 8C in an assembled embodiment form.

Figure 9:
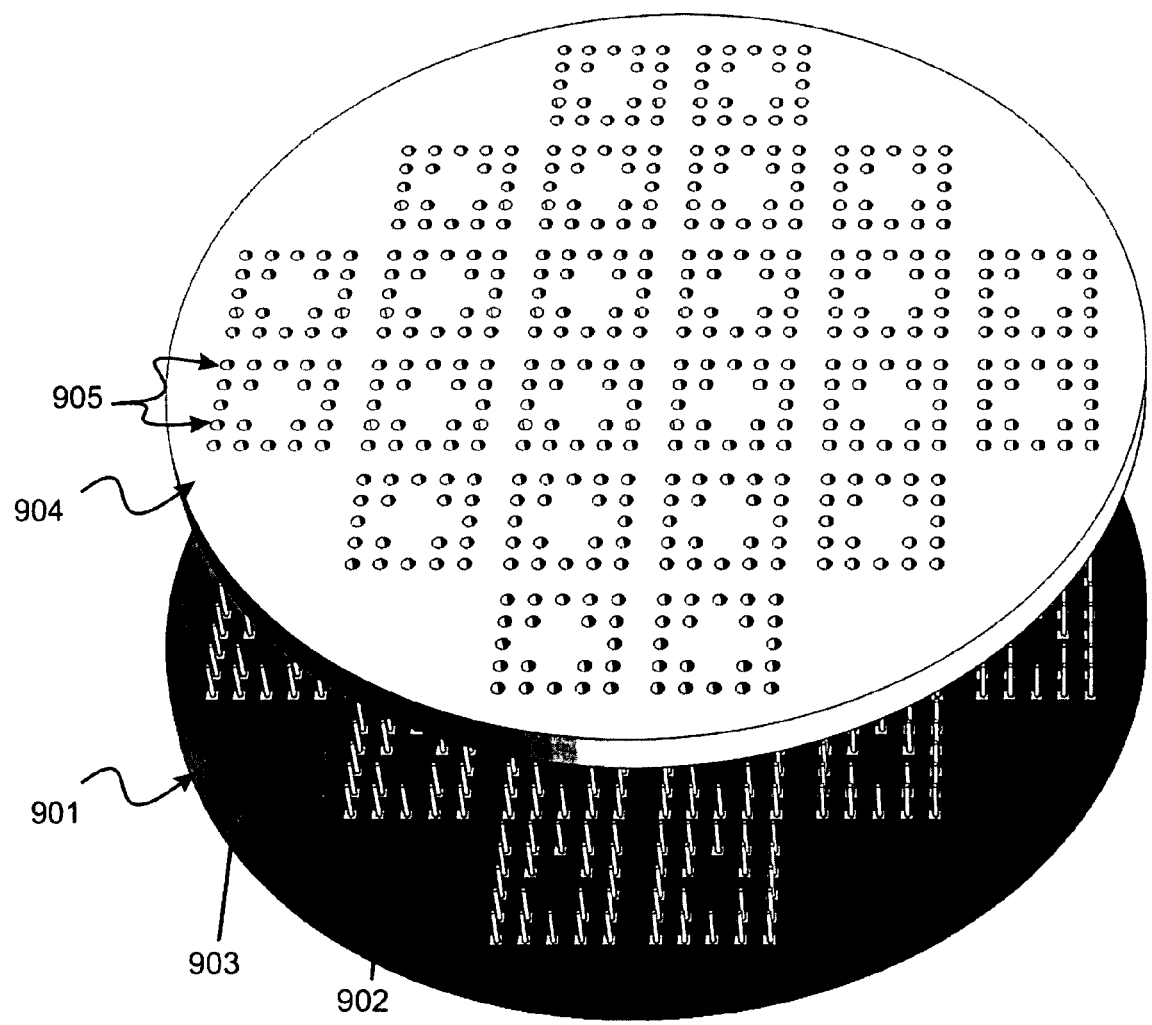
FIG. 9 provides a perspective view of a method for making an embodiment directly on a wafer.

FIG. 9 provides a perspective view of a method for making an embodiment directly on a wafer. In the figure a silicon wafer having a plurality of ICs 901 and termination bond pads for the ICs 902 is processed by wire bonding bond wires to the bond pads and terminating the wires at a desired vertical length 903, such as by flaming off the wires with an electrical spark. The conductive core structure 904 with apertures 905 can then be placed on the wired bonded assembly. The holes can be filled by coating the assembly with a liquid polymer and drawing a vacuum to expel trapped air. Alternatively a thin layer of liquid polymer can be first applied to the wafer assembly and the metal core placed on the assembly relying on capillary action to fill the holes. This of course, can be assisted by vacuum as well. The cured assembly can then be surface lapped to expose the wire bond wire end contacts.

Figure 10:
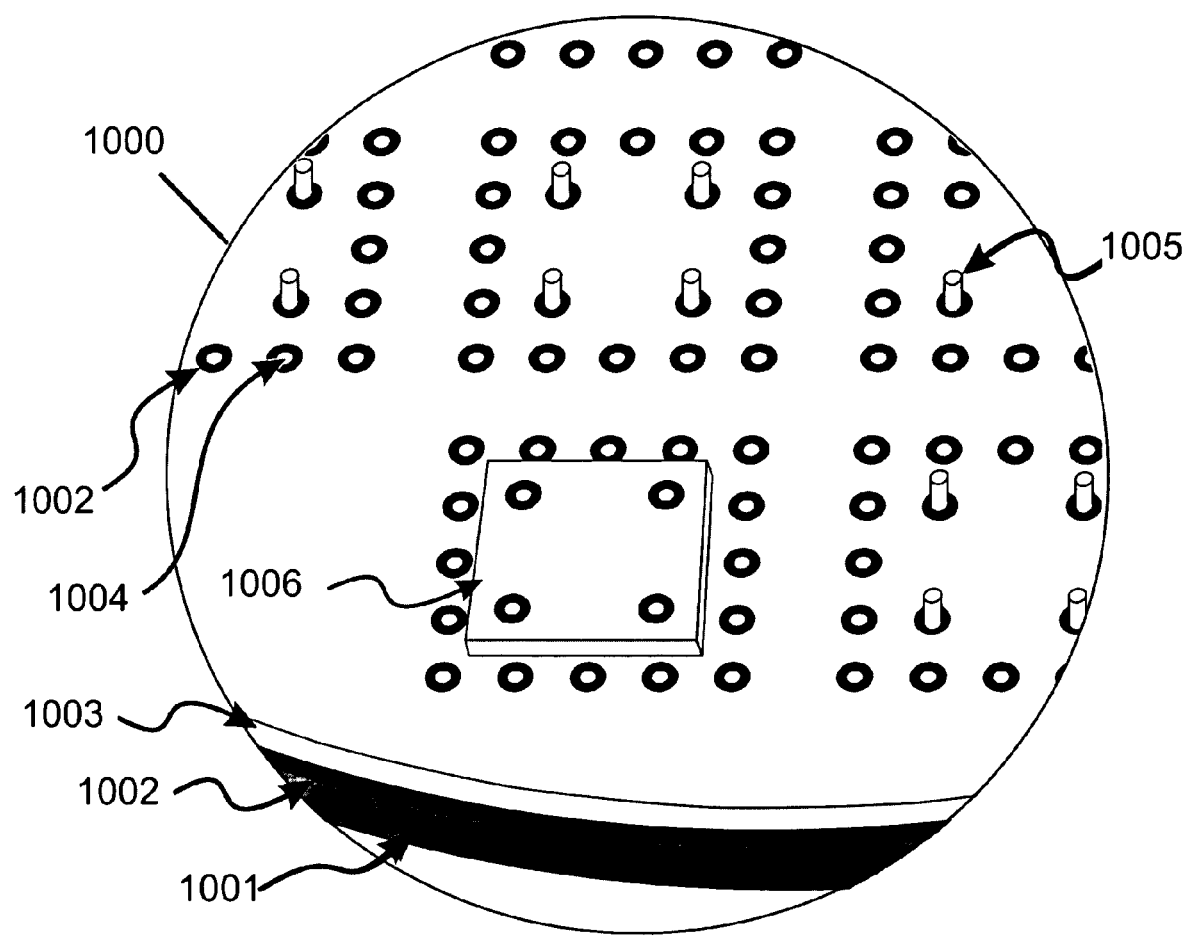
FIG. 10 provides close up perspective view of a wafer level assembled embodiment that has a stair step.

Though not specifically shown in FIG. 9, it should be noted that it is also possible to bond the wires to a substrate having shielding features and then attach the substrate to a prepared wafer in a manner such as shown in FIG. 8C FIG. 10 provides close up perspective view of a wafer level assembly embodiment 1000 comprising an IC semi-conductor wafer 1001 bonded to a core 1003 by means of a suitable insulator 1002. In the image, while most wire termination ends 1004 are shown planar with the surface certain wires 1005 rise vertically from the surface. A discrete core piece 1006 designed to placed atop the free standing wires is shown. The resulting structure is a stair step structure that is suitable for use and attachment to mating stair step structures. While this approach is possible for wafer level, it is also possible to create a structure that has all terminations at a common level to start and then machine the full assembly to create stair step structures in situ by cutting into the core with wires to different levels.

While the full wafer assembly embodiment described may offer the best economy of scale, the staking method described for the second layer can be employed for the entire structure while still in wafer form by stacking layers of cores of decreasing dimensions which result in a layered stair step interposer.

Although the invention has been described with reference to specific exemplary embodiments thereof, it will be evident that various modifications and changes may be made thereto without departing from the broader spirit and scope of the invention. The specification and drawings are, accordingly, to be regarded in an illustrative rather than in a restrictive sense.

What is claimed is:

1. An electrical interconnect structure for interconnecting with at least one integrated circuit die, the electrical interconnect structure comprising:
    a conductive core having first and second sides, the first side including first and second surfaces arranged in a stairstep relationship to each other, wherein the first surface is a conductive surface;
    a first aperture extending through the conductive core from the first surface to the second side, the first aperture having a conductive circumferential wall;
    a second aperture extending through the conductive core from the second surface to the second side;
    a first signal path extending through the first aperture and having an end adapted to connect to an integrated circuit device, wherein the first signal path is electrically conductive;
    a second signal path extending through the second aperture, and;
    a first insulating member disposed within the first aperture to electrically insulate the first signal path from the conductive circumferential wall of the first aperture.

2. The electrical interconnect structure of claim 1 further comprising a circuit layer, at least a portion of the circuit layer being conductively coupled to the first signal path.

3. The electrical interconnect structure of claim 1 further comprising at least one optical connection path that extends through the electrical interconnect structure.

4. The electrical interconnect structure of claim 1 wherein the second aperture has a conductive circumferential wall, and wherein the second signal path is a conductive signal path, the electrical interconnect structure further comprising a second insulating member disposed within the second aperture to electrically insulate the second signal path from the conductive circumferential wall of the second the aperture.

5. The electrical interconnect structure claim 1 wherein the first signal path is substantially centered within the first insulating member such that the conductor and the wall of the conductive core form a coaxial signal path.

6. The electrical interconnect structure of claim 5 wherein the coaxial signal path has a controlled impedance.

7. The electrical interconnect structure of claim 1 further comprising a resistive device coupled to the first signal path.

8. The electrical interconnect structure of claim 7 wherein the resistive device is formed integrally with the electrical interconnect structure.

9. The electrical interconnect structure of claim 1 further comprising a capacitive device coupled to the first signal path.

10. The electrical interconnect structure of claim 9 wherein the capacitive device is formed integrally with the electrical interconnect structure.

11. The electrical interconnect structure of claim 1 further comprising an electro-static discharge (ESD) protection element coupled to the first signal path.

12. The electrical interconnect structure of claim 11 wherein the ESD protection element is formed integrally with the electrical interconnect structure.

13. The electrical interconnect structure of claim 1 wherein the conductive core comprises an insulating substrate plated with conductive material.

14. The electrical interconnect structure of claim 1 wherein the conductive core forms a ground element.

15. The electrical interconnect structure of claim 1 further comprising:
    a layer of circuit traces wherein the circuit traces are interconnected to a plurality of conductive signal paths extending thorough a respective plurality of apertures in the conductive core conductor, each of the plurality of apertures having a conductive circumferential wall, including the first signal path extending through the first aperture; and
    a plurality of insulating members, each insulating member disposed within a corresponding one of the plurality of apertures to isolate the each of the conductive signal paths from the conductive circumferential wall of its respective aperture.

16. The electrical interconnect structure of claim 1 wherein the conductive core is comprised of an electrically conductive material.

* * * * *